(12) United States Patent
Xia et al.

(10) Patent No.: US 7,132,353 B1
(45) Date of Patent: Nov. 7, 2006

(54) BORON DIFFUSION BARRIER BY NITROGEN INCORPORATION IN SPACER DIELECTRICS

(75) Inventors: Li-Qun Xia, Santa Clara, CA (US);
Mei-Yee Shek, Mountain View, CA (US); Troy Kim, Mountain View, CA (US); Vladamir Zubkov, Mountain View, CA (US); Ritwik Bhatia, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/195,398

(22) Filed: Aug. 2, 2005

(51) Int. Cl.
*H01L 21/3205* (2006.01)

(52) U.S. Cl. .................. 438/585; 438/591; 438/791; 257/E21.626

(58) Field of Classification Search .............. 438/618, 438/778, 791, 792, 787, 585, 591
See application file for complete search history.

(56) References Cited

U.S. PATENT DOCUMENTS

| | | | |
|---|---|---|---|
| 6,682,980 B1 * | 1/2004 | Chidambaram et al. .... | 438/302 |
| 6,803,321 B1 | 10/2004 | Blosse et al. | |
| 6,972,222 B1 * | 12/2005 | Cho et al. .................. | 438/197 |
| 2002/0052124 A1 * | 5/2002 | Raaijmakers et al. ....... | 438/778 |
| 2003/0020111 A1 | 1/2003 | Bevan | |
| 2004/0110351 A1 * | 6/2004 | Narasimha .................. | 438/302 |
| 2004/0188779 A1 | 9/2004 | Liu et al. | |
| 2004/0194706 A1 | 10/2004 | Wang et al. | |
| 2005/0250308 A1 * | 11/2005 | Yamaguchi et al. ........ | 438/618 |
| 2005/0266622 A1 * | 12/2005 | Arghavani et al. .......... | 438/197 |

* cited by examiner

*Primary Examiner*—Asok K. Sarkar
*Assistant Examiner*—Victor V. Yevsikov
(74) *Attorney, Agent, or Firm*—Townsend and Townsend and Crew LLP

(57) ABSTRACT

A method of forming a sidewall spacer on a gate electrode is described. The method includes generating a first plasma from a silicon containing precursor and oxide precursor, and forming a silicon oxy-nitride layer on the sidewall of the gate electrode. The method also includes generating a second plasma from the silicon containing precursor and a nitrogen precursor, and forming a nitride layer on the silicon oxy-nitride layer. The silicon containing precursor can flow continuously between the generation of the first and the second plasmas. Also, a method of forming a sidewall spacer on the side of a gate electrode on a substrate. The method includes forming an oxy-nitride layer on the sidewall, and forming a nitride layer on the oxy-nitride layer, where the substrate wafer is not exposed to air between the formation of the layers.

36 Claims, 11 Drawing Sheets

BORON DIFFUSION BARRIER BY NITROGEN INCORPORATION IN SPACER DIELECTRICS

CROSS-REFERENCES TO RELATED APPLICATIONS

NOT APPLICABLE

BACKGROUND OF THE INVENTION

Many modern semiconductor devices are composed of MOS (Metal-Oxide-Semiconductor) transistors and capacitors, in which the MOS transistors generally include a source, drain, and gate. The gate is sometimes called a gate stack because it may include a plurality of components, such as a gate electrode and an underlying gate dielectric. Sidewall spacers (also called spacers, or spacer layers) may be adjacent to the gate structure and usually include an oxide layer and a nitride layer component.

Spacers serve a number of functions in the formation of semiconductor devices. One function is to prevent the migration of dopants from the source and drain regions (and halo sections) upward into overlying layers (e.g., oxide layers such as the gate oxide layer, etc.). When dopants (e.g., boron) migrate upward it sets up concentration gradients in the underlying source or drain region, which can cause parasitic junctions that increase power consumption by the transistor. Spacers act as a barrier to this type of dopant migration.

The spacers may also serve to shield the gate electrode and halo sections of the transistor from subsequent dopant deposits, such as when the source and drain regions are being formed. The sidewall spacer layers covering the gate electrode and halo sections prevent dopants in the processing chamber from migrating into these regions as the source and drain regions are formed.

Conventional spacers are made by forming silicon oxide ($SiO_2$) and/or silicon nitride ($Si_3N_4$) layers in low pressure chemical vapor deposition processes (LPCVD). In such LPCVD methods, a nitrogen-containing gas is reacted with a silicon-containing gas to deposit silicon-nitride on the substrate. LPCVD processes typically occur at operating temperatures of about 600° C. to about 800° C. At these temperatures, lighter dopants like boron can undergo significant thermal diffusion, cause the dopant region to expand or shift, and reducing the dopant concentration in the desired dopant region. Thermal diffusion can also cause dopant regions to move closer and even overlap with each other, causing short channel and punch-through effects. Thus, it is desirable to develop new, lower temperature spacer formation techniques that do not cause as much thermal diffusion of the deposited dopants.

Conventional sidewall spacers typically include a robust silicon nitride layer that can trap dopants like boron and prevent them from diffusing into the gate electrode, implant region, etc. Unfortunately, $Si_3N_4$ films have relatively poor dielectric qualities (k values of about 7.0 or more) which can increase the time constant (RC) for activating the gate electrode and slow the speed of the device. The dielectric qualities of the spacers may be improved by combining the high-k nitride layer with a lower-k silicon oxide film (e.g., k values of 4.0 or less) to lower the overall k value of the spacer. However, the silicon oxide film is relatively permeable to dopants like boron, limiting the extent to which $SiO_2$ can substitute for $Si_3N_4$ in the spacer layers. Thus, there is a need for spacer layers with improved dielectric qualities and dopant diffusion characteristics. These and other issues are addressed by embodiments of the present invention.

BRIEF SUMMARY OF THE INVENTION

Embodiments of the invention include methods of forming sidewall spacers on gate electrodes. The methods may include the steps of generating a first plasma from a silicon containing precursor and oxide precursor, and forming a silicon oxy-nitride layer on the sidewalls of the gate electrodes. The methods may also include generating a second plasma from the silicon containing precursor and a nitrogen precursor, and forming nitride layers on the silicon oxy-nitride layers. The silicon containing precursor may flow continuously between the generation of the first and the second plasmas.

Embodiments of the invention also include methods of forming sidewall spacers on substrate wafers having gate electrodes. The methods may include generating a first plasma from a silicon containing precursor and oxide precursor, and forming an oxide layer on the sidewall of the gate electrode, wherein at least a portion of the layer comprises silicon oxy-nitride, and generating a second plasma from the silicon containing precursor and a nitrogen precursor, and forming a nitride layer on the oxide layer. The substrate wafers may not be exposed to air between the generation of the first and second plasmas.

Embodiments of the invention still further include processes of fabricating transistors having gate electrodes. The processes may include the steps of depositing a first dopant region, at least a portion of which is under the gate electrode, and forming a sidewall spacer on the gate electrode. The sidewall spacer is an oxy-nitride layer formed on the gate electrode by generating a plasma from a silicon containing precursor and oxide precursor that contains nitrogen (e.g., $N_2O$, a mixture of oxygen and ammonia, etc.). The processes may further include depositing a second dopant region adjacent to the first dopant region, where at least a portion of the second dopant region is under the sidewall spacer.

Additional embodiments and features are set forth in part in the description that follows, and in part will become apparent to those skilled in the art upon examination of the specification or may be learned by the practice of the invention. The features and advantages of the invention may be realized and attained by means of the instrumentalities, combinations, and methods described in the specification.

DETAILED DESCRIPTION OF THE INVENTION

The present invention relates to the formation of silicon oxy-nitride (Si—O—N) in the sidewall spacers of a semiconductor device, which improves the dielectric qualities and dopant diffusion barrier properties of the spacer compared to conventional $SiO_2/Si_3N_4$ spacers. The present invention also relates to forming the layers of a sidewall spacer with plasma-enhanced chemical vapor deposition (PECVD), which permits the layers to be formed at lower temperatures (e.g., about 400° C. to about 550° C.) than conventional LPCVD (e.g., 600° C. to 800° C.). Embodiments of the present methods may be used to fabricate semiconductor integrated circuits and devices with low-k spacer layers (e.g., k values from about 4 to about 5) and reduced dopant diffusion in the channel regions and gate electrodes of the transistors.

The silicon oxy-nitride may be deposited as a separate oxy-nitride layer on the sidewall of the gate electrode. Alternatively, the Si—O—N may be incorporated into a silicon oxide layer formed on the gate electrode. The Si—O—N may be deposited using a plasma generated from an oxide precursor that contains nitrogen, such as nitrous oxide ($N_2O$), and/or mixtures of an oxygen containing precursor (e.g., $O_2$, $O_3$), and a nitrogen containing precursor (e.g., $NH_3$). The spacer may be made exclusively from the oxy-nitride layer, or second plasma may be subsequently generated from silicon and nitrogen containing precursors to form a nitride layer on the oxide and/or oxy-nitride layer. The resulting sidewall spacer is dense, hermetic to block moisture, provides a barrier to diffusing dopants, and has improved dielectric properties. Additional details of the methods of forming sidewall spacers according to embodiments of the invention will now be described.

Exemplary Methods

Figure 1A:
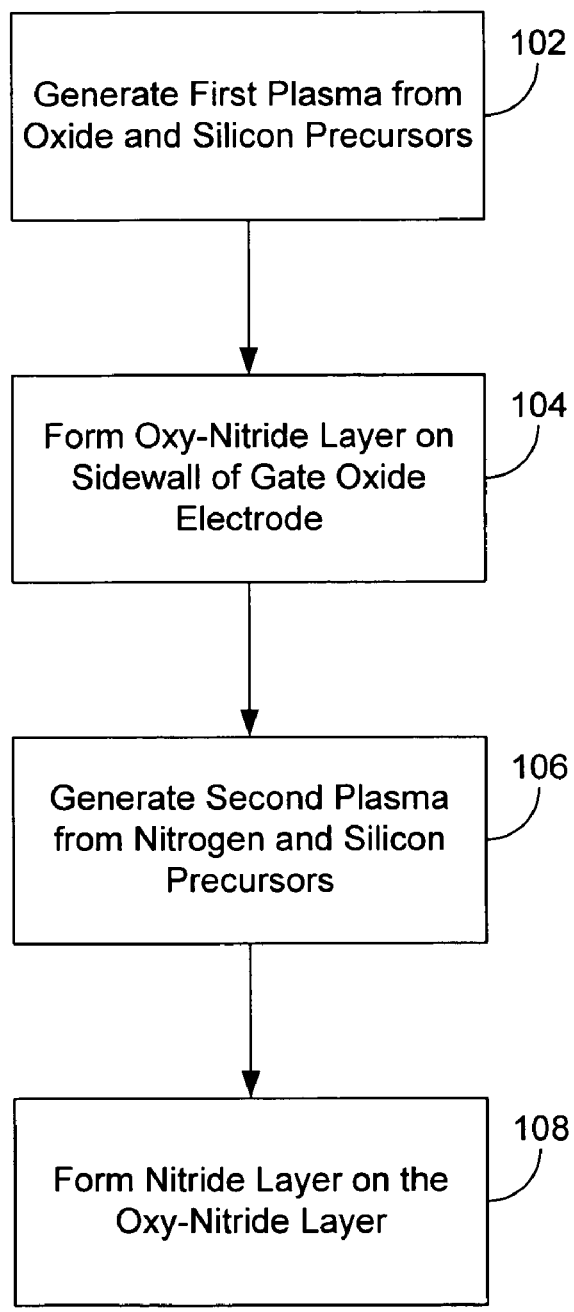
FIGS. 1A–B are a flowcharts illustrating methods of forming sidewall spacers according to embodiments of the invention.

FIG. 1A is a flowchart illustrating a method 100 of forming sidewall spacers according to embodiments of the invention. The method 100 includes generating a first plasma 102 from a plasma precursor mixture that includes a nitrogen-containing oxide precursor (e.g., $N_2O$), and a silicon containing precursor (e.g., $SiH_4$, BTBAS, methyl-silane, etc.). The first plasma is used to form an oxy-nitride layer on the sidewall of a gate oxide electrode 104. The concentration of the Si—O—N may be uniform throughout the layer, or may change as a function of the distance from the gate electrode.

Once the silicon oxy-nitride layer is formed, second plasma may be generated from a plasma precursor mixture that includes a nitrogen containing precursor (e.g., $NH_3$) and a silicon containing precursor 106. The second plasma may be used to form a silicon nitride layer on the oxy-nitride layer 108 to make the sidewall spacer layer.

Switching precursors between the first and second plasmas may be done in situ in a PECVD processing chamber without having to move the substrate wafer between chambers. This prevents boron in the ambient air from contaminating the substrate before both the oxy-nitride and nitride layers of the sidewall spacer are formed. In some embodiments, a continuous flow of the silicon precursor may be maintained as the oxide precursor is switched to the nitride precursor between formation of the oxy-nitride and nitride layers. These embodiments may also include continuously maintaining the plasma between the generation of the first and second plasma when the oxide precursor supplied to the first plasma is replaced by the nitride precursor supplied to the second plasma. Alternatively, embodiments include stopping the flow of both the oxide and silicon containing precursors at the end of the formation of the oxy-nitride layer before starting the flow of the nitride and silicon containing precursors to form the nitride layer.

Figure 1B:
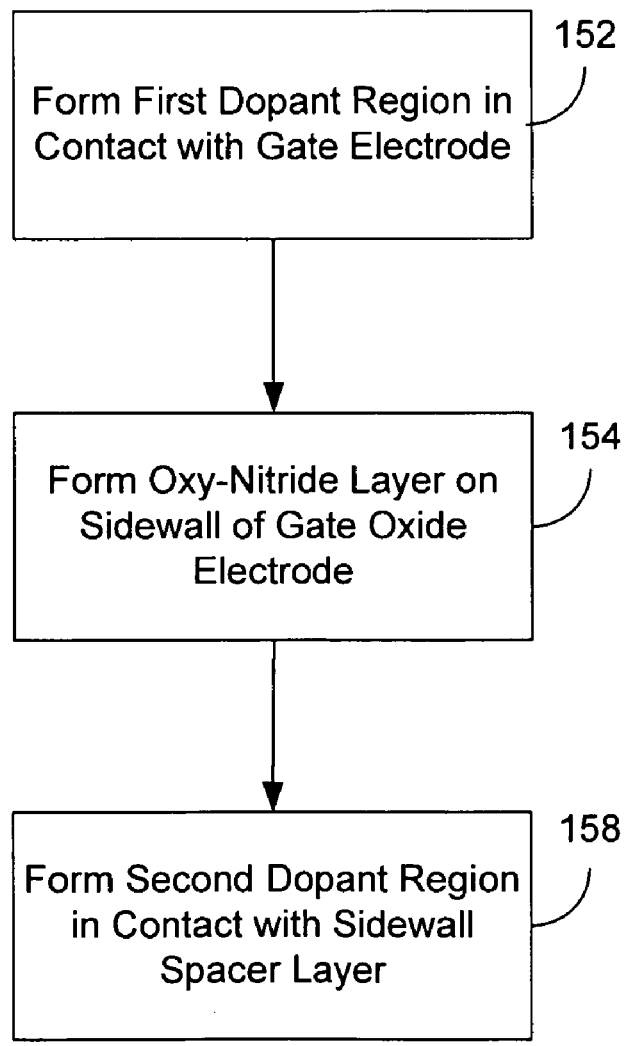

Referring now to FIG. 1B a flowchart illustrating a method 150 of forming a transistor according to embodiments of the invention is shown. The method 150 includes the formation of a first dopant region 152 in a part of the transistor substrate that contacts the gate electrode. The first dopant region, sometimes called the implant or halo region, may extend under the gate electrode of the transistor, and form an end of the channel region under the gate electrode. A a sidewall spacer layer made from an oxy-nitride film may be formed over the first dopant region on a sidewall of the gate oxide electrode 154. As noted above, the oxy-nitride layer may be formed from constituents of a plasma made from a silicon precursor and an oxide precursor that also contains nitrogen, such as nitrous oxide, or a mixture of oxygen (or ozone) and ammonia. Embodiments include making the sidewall spacer exclusively from the oxy-nitride film to provide a spacer layer with a low k value (e.g., about 4.5 or less). Embodiments also include forming a second nitride layer on the oxy-nitride layer to make the sidewall spacer.

Following the formation of the sidewall spacer layer on the gate electrode, a second dopant region may be formed on the substrate 158 and may have a significantly higher dopant concentration than the first dopant region. The second dopant region may be in electrical contact with the first dopant region, and may constitute a source or drain region of the transistor. The sidewall spacer layer acts as a dopant barrier to prevent dopant materials that form the second dopant region from contaminating the sides of the gate electrode and creating parasitic capacitance, or even an electrical short, between the gate electrode and the source/drain regions of the transistor.

Figure 2:
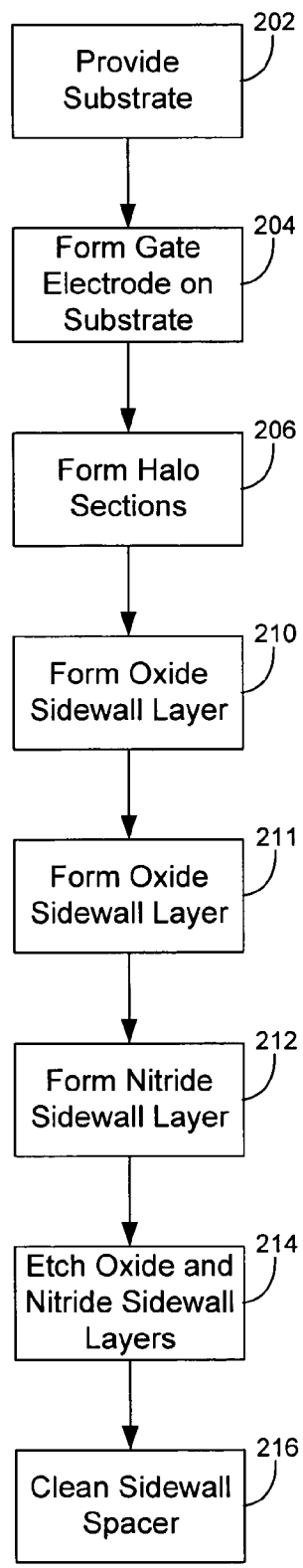
FIG. 2 is a flowchart illustrating methods of fabricating a transistor according to embodiments of the invention.

Referring now to FIG. 2, a flowchart that includes steps for a method of making a transistor according to additional embodiments of the present invention is shown. The method starts with providing a substrate (e.g., a silicon wafer) in step 202 and then forming a gate electrode on the substrate in step 204. Forming the gate electrode may include depositing one or more layer on the substrate (e.g., an oxide layer, a polysilicon layer, etc.) followed by patterned etching to form the gate electrode.

Halo sections are formed in the substrate in step 206 following the formation of the gate electrode. The halo sections may be formed by, for example, conventional ion implantation, which may optionally be followed by one or more annealing steps. In some embodiments of the method (not shown), the halo sections are formed in the substrate prior to the formation of the gate electrode.

An oxide sidewall layer may be formed 210 on a side of the gate electrode and a portion of the substrate adjacent to the electrode. As noted above, the oxide sidewall layer may be formed using plasma enhanced CVD to generate a plasma from an oxide precursor, such as oxygen, ozone, etc., and a silicon containing precursor, such as silane, alkyl-silane, halo-silane, bis-t-butylaminosilane (BTBAS), tetraethyloxysilicate (TEOS), etc. In addition to (or in lieu of) the formation of the oxide sidewall layer, an oxy-nitride sidewall layer may be formed 211. The oxy-nitride layer may be formed by strking a plasma from a nitrogen containing oxide precursor (such as N$_2$O, or a mixture of an oxygen containing gas and a nitrogen containing gas) and a silicon containing precursor.

Following the formation of the oxide and/or oxy-nitride sidewall layer, a nitride sidewall layer may be formed 212. The nitride layer may be deposited with a plasma that uses the same or different silicon containing precursor as the oxide/oxy-nitride layers combined with a nitride precursor, such as NH$_3$. In some embodiments, the silicon containing precursor flows continuously as the oxide containing precursor (or nitrogen containing oxide precursor) is switched to the nitride precursor. The switch creates the second plasma that deposits the nitride sidewall layer on the previously formed oxide and/or oxy-nitride layers.

In one example, the formation of the sidewall layers includes flowing silane at about 40 to about 60 standard cubic centimeters per minute (sccm), with nitrous oxide also at about 200 to 600 sccm and a helium carrier gas at 13,500 sccm, during the formation of an oxy-nitride sidewall layer. Then, a nitride layer is formed by flowing the silane at about 200 to 400 sccm with NH$_3$ at a flow rate of about 3000 to 5000 sccm.

In both the formation of the oxy-nitride and nitride sidewall layers, the pressure of the gases used in the PECVD chamber may have a range of about 2.5 torr to about 6 torr and the RF generators used to strike and maintain the plasma may use a high-frequency power range of about 100 to about 300 Watts, and a low-frequency power of about 0 Watts to about 200 Watts. The deposition temperature may range from about 250° C. to about 550° C. The substrate is spaced from about 250 mils to about 480 mils from the top electrode (e.g., showerhead).

The sidewall spacers formed may be substantially conformal to the substrate and gate electrode. A substantially conformal sidewall spacer is formed in such a manner that the thickness of the spacer is similar on both the vertical and horizontal surfaces to the underlying patterned layer. In some embodiments, an etch step 214 may occur to further shape the spacer. For example, the spacer may be etched to have closer conformity with the L-shaped corner formed by the substrate and gate electrode. Following the etching of the nitride sidewall layer (and possibly the oxide sidewall layer) the sidewall spacer may be cleaned 216 in preparation for further fabrication processes (e.g., silicidation).

Exemplary Transistor

Figure 3A:
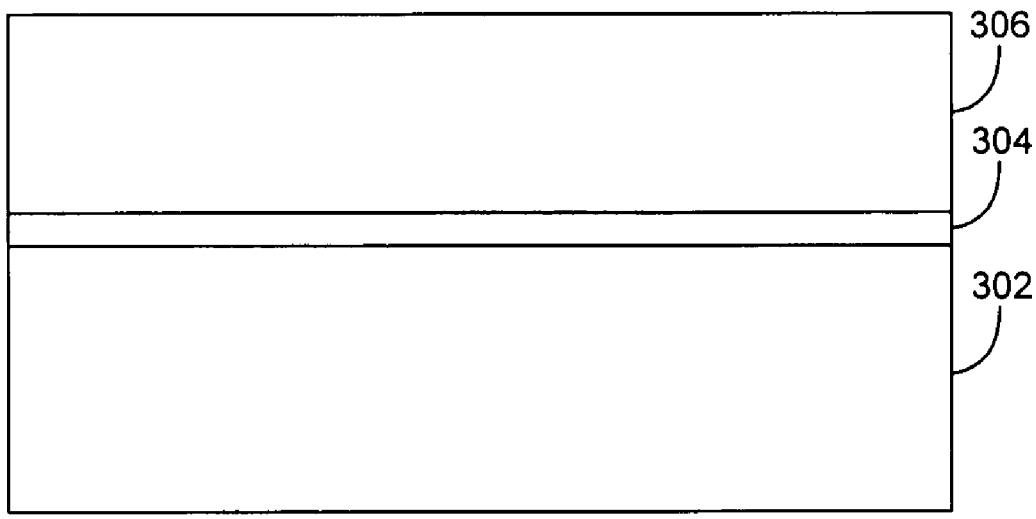
FIGS. 3A–E show cross-sections of a transistor at selected stages of fabrication according to embodiments of the invention.

Referring now to FIG. 3A, a semiconductor substrate 302 (e.g., a silicon wafer) is shown with gate oxide layer 304 on a top surface and a polysilicon gate layer 306 over oxide layer 304. Gate oxide layer 304 may be a thermally grown SiO$_2$ layer with a thickness of about 30 Å or less. After the gate oxide layer 304 is formed, the polysilicon gate layer 306 may be deposited using conventional techniques (e.g., low pressure CVD, etc.) to a thickness of about 100 Å or more (e.g., from about 100 Å to about 500 Å) to provide the structure illustrated in FIG. 3A. Additional layers (not shown) may also be present, such as an additional oxide layer above polysilicon gate layer 306 to form an oxide/polysilicon stack.

Figure 3B:
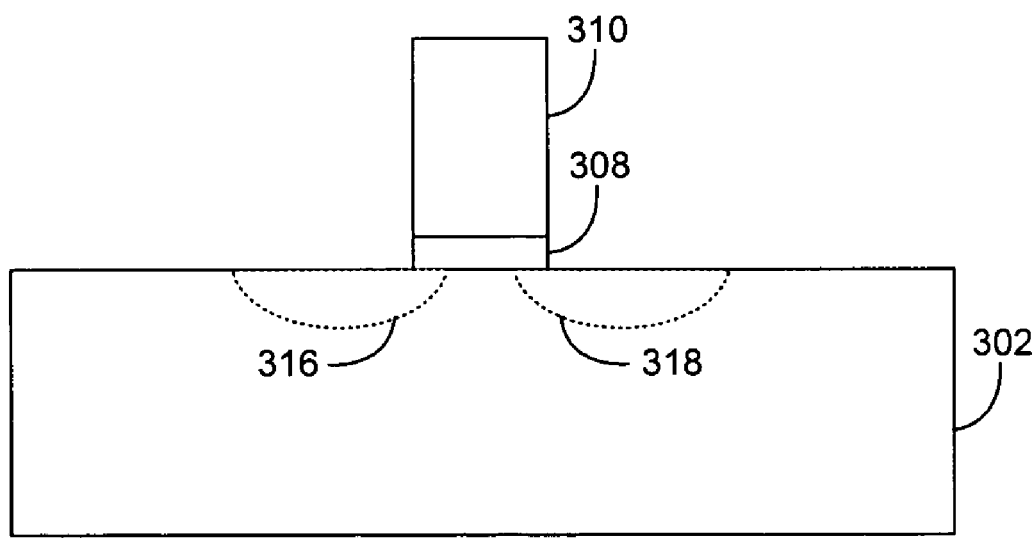

Referring now to FIG. 3B, the stack shown in FIG. 3A is pattern etched to form gate oxide 308 and gate electrode 310. The gate oxide 308 may have a thickness (i.e., height) of about 10 Å to about 50 Å and the gate electrode may have a thickness of about 500 Å to about 2500 Å.

Halo sections 316 and 318 may also be formed in substrate 302 via ion implantation. For example, dopant ions in concentrations of about $1 \times 10^{12}$ to about $1 \times 10^{14}$ ions/cm$^2$ may be accelerated into substrate 302 with implant energy of about 25 keV to about 60 keV to form halo sections 316 and 318. In some embodiments, after ion implantation the device may undergo one or more thermal anneals to position the dopants. For example, the device may be annealed at a temperature of about 900° C. to about 1100° C. In another example, the device may undergo rapid thermal annealing (RTA).

Figure 3C:
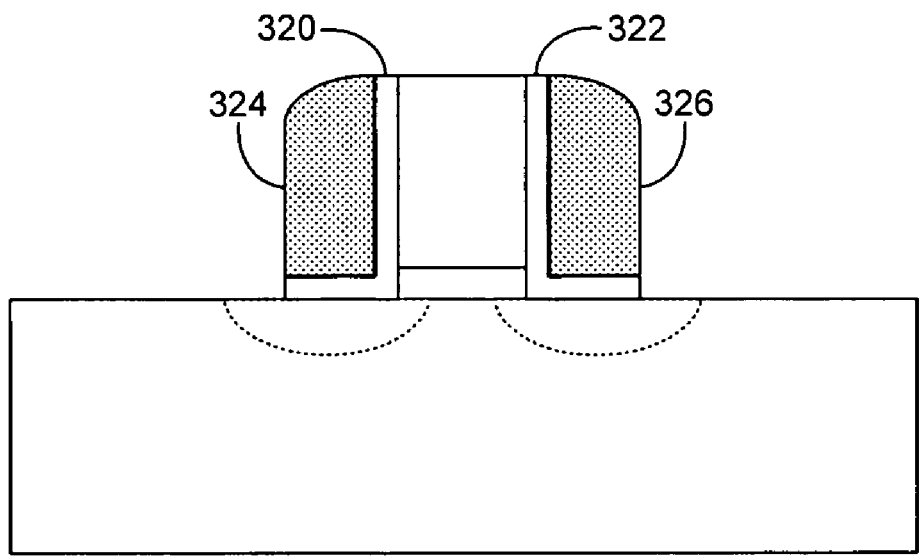

FIG. 3C shows a pair of sidewall spacers formed on the sides of gate oxide 308 and gate electrode 310. The sidewall spacers include oxy-nitride layers 320 and 322 (which may be in physical contact with the gate electrode 310 and/or gate oxide 308) and nitride layers 324 and 326 formed on the oxy-nitride layers 320 and 322, respectively.

The spacers may be formed using a plasma CVD process according to embodiments of the invention. The process may include flowing a silicon precursor and a nitrogen containing oxide source into a process chamber and striking a plasma with plasma CVD to deposit the oxy-nitride layers 320 and 322. The nitrogen containing oxide source may be N$_2$O. In some embodiments, the silicon containing precursor may still be flowing when the nitrogen containing oxide precursor is switched to a nitrogen source (e.g., NH$_3$) to generate a nitride gas and a second plasma is used to form nitride layers 324 and 326.

Figure 3D:
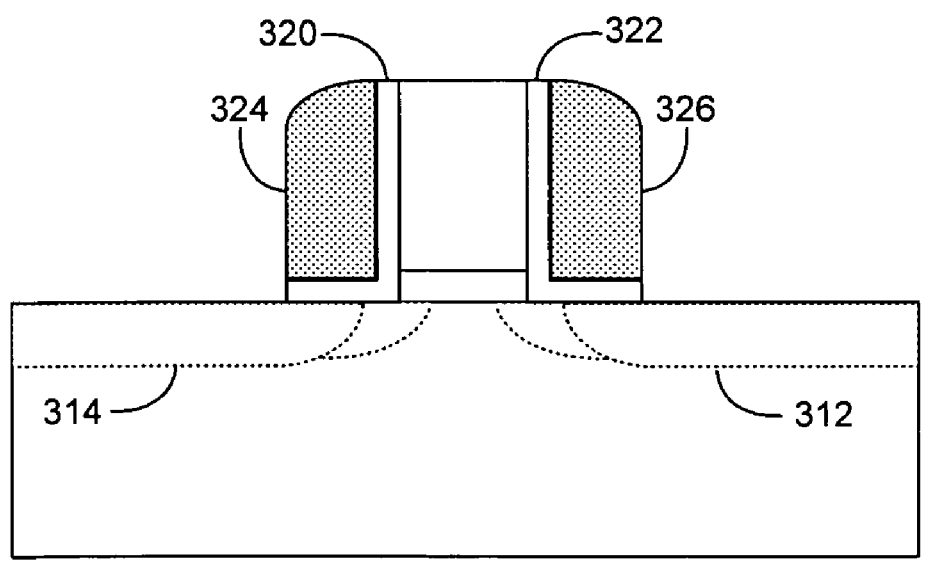

As shown in FIG. 3D, source and drain regions 312, 314 may be formed in substrate 302 following the formation of the sidewall spacer. The source and drain regions 312, 314 may be formed using conventional ion implantation, where for example, ions (e.g., silicon ions, germanium ions, etc.) may be accelerated at about 5 keV to about 130 keV into the single crystal substrate 302 to form amorphous silicon implant regions. Accompanying the bombardment ions are dopants that are typically delivered in a dose of about $10^{15}$ ions/cm$^2$ (e.g., about $1 \times 10^{13}$ to about $1 \times 10^{15}$ ions/cm$^2$). The dopants may be any dopant appropriate for the semiconductor device being manufactured, such as phosphorous, arsenic, etc. for an NMOS device, and boron, indium, etc. for a PMOS device.

Figure 3E:
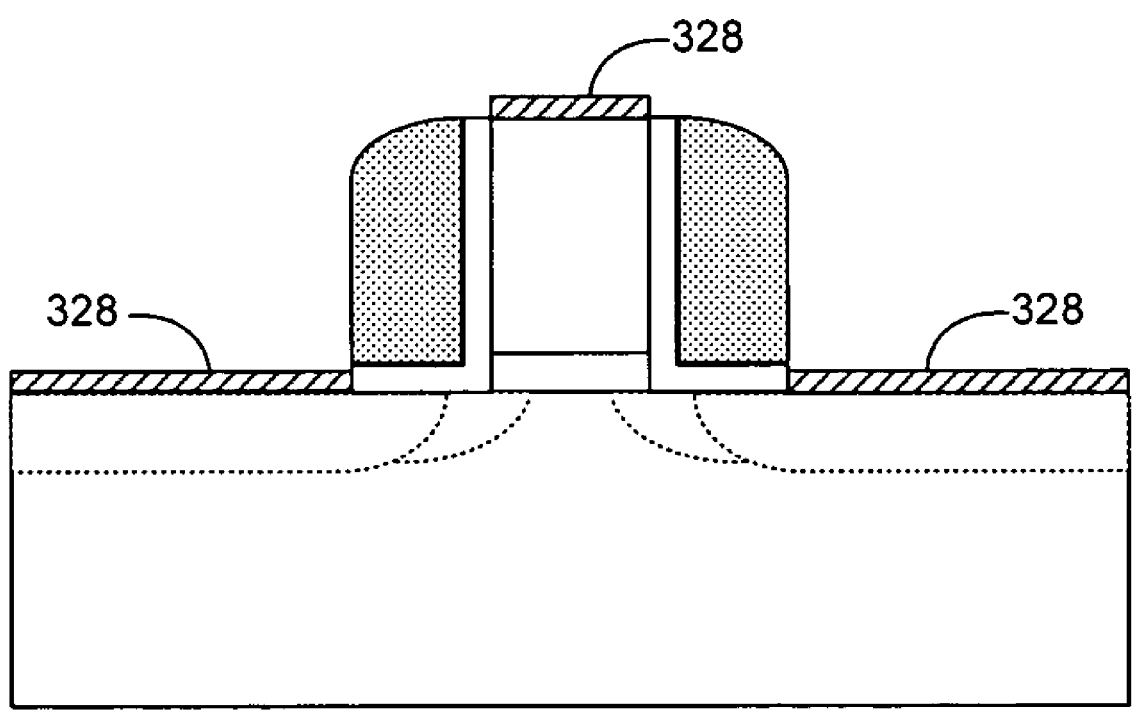

Referring now to FIG. 3E, following the formation of the spacers a silicidation step may occur to form silicide layers 328. The silicide layers 328 are conductive and may be alloys of metal (e.g. Ti, Co, Ni, etc.) and silicon that was formed from the reaction of a metal layer (not shown) with the underlying source-drain regions and gate electrode 314, 312 and 310. In post-silicidation steps, electrical contacts (not shown) may be formed on silicide layers 318 to conduct electrical signals to and from the transistor.

Experimental

Tests were conducted to measure boron diffusion characteristics for a sidewall spacer made according to embodiments of the invention. Comparative examples were also done by measuring boron diffusion characteristics of a sidewall spacer made from the combination of a silicon oxide layer and silicon nitride layer formed on the side of a transistor gate electrode.

For the sidewall spacer layers made according to embodiments of the invention, oxy-nitride and nitride layers were deposited on the side of a gate electrode of a transistor. A first plasma was formed in a PECVD chamber from SiH$_4$ and N$_2$O and a Si—O—N layer was deposited on the sidewalls of the transistor gate electrodes. The chamber was then evacuated, and a second plasma was formed from SiH$_4$ and NH$_3$ to deposit a Si$_3$N$_4$ layer on the Si—O—N layer.

The plasma deposition of both the oxy-nitride and nitride layers was done at 400° C. Additional details of the sidewall spacer deposition are given in Table 1 below:

TABLE 1

Experimental Parameters for Formation of Sidewall Spacer

| Parameter | Step 1 | Step 2 | Step 3 | Step 4 | Step 5 | Step 6 |
|---|---|---|---|---|---|---|
| Step Name | Form 1st Plasma | Si—O—N Deposition | Evacuate Chamber | Form 2nd Plasma | Nitride Deposition | Final Pump |
| Step Duration (sec) | 10 | 6 | 10 | 10 | 42 | 10 |
| Heater Temp (° C.) | 400 | 400 | 400 | 400 | 400 | 400 |
| Chamber Pressure (Torr) | 5 | 5 | 0 | 2.5 | 2.5 | 0 |
| RF1 Time (sec) | 0 | 6 | 0 | 0 | 42 | 0 |
| RF2 Time (sec) | 0 | 6 | 0 | 0 | 42 | 0 |
| HFRF1 Power (Watts) | 0 | 80 | 0 | 0 | 100 | 0 |
| HFRF2 Power (Watts) | 0 | 80 | 0 | 0 | 100 | 0 |
| LFRF1 Power (Watts) | 0 | 30 | 0 | 0 | 40 | 0 |
| LFRF2 Power (Watts) | 0 | 30 | 0 | 0 | 40 | 0 |
| $SiH_4$ Flow Rate (sccm) | 55 | 55 | 0 | 240 | 240 | 0 |
| $N_2O$ Flow Rate (sccm) | 500 | 500 | 0 | 0 | 0 | 0 |
| He Flow Rate (sccm) | 13,500 | 13,500 | 0 | 0 | 0 | 0 |
| $NH_3$ Flow Rate (sccm) | 0 | 0 | 0 | 3200 | 3200 | 0 |
| $N_2$-Hi Flow Rate (sccm) | 0 | 0 | 0 | 4000 | 4000 | 0 |

In the comparative example, the sidewall spacer formation temperature was also 400° C. but the silicon oxy-nitride layer was replaced with a conventional silicon oxide layer. Details on the formation of the oxy-nitride layer compared to the oxide layer are shown below in Table 2:

TABLE 2

Experimental Parameters for Oxy-Nitride and Oxide Layer Formation

| Experimental Parameters | Oxy-Nitride Layer | Oxide Layer |
|---|---|---|
| Temperature (° C.) | 400 | 400 |
| Deposition Rate (Å/min @ 500 A) | 775 | 430 |
| WIW Unif. (% 1σ, @ 100A) | 1.4 | 1.2 |
| Stress (MPa) | −210 | −350 |
| RI (@ 500 Å) | 1.525 | 1.46 |
| WERR (6:1 BOE) | 1.05 | 1.37 |
| WERR (100:1 HF) | 2.41 | 2.03 |
| WER Unif. (100:1 HF) | 1.53% | 2.57% |
| k | 4.5 | 4.25 |
| Composition by RBS (Si/O/N/H) | 34.1/55.2/5/5.7 | 34/64.9/0/1.1 |
| Pressure (Torr) | 5 | 5 |
| HF/LF RF (Watts) | 80/30 | 230/50 |
| Spacing (mils) | 800 | 420 |
| Process Gas (sccm) | $SiH_4$ 55 $N_2O$ 500 He 13,500 | TEOS 500 mgm $O_2$ 8000 He 9000 |

Figure 4:
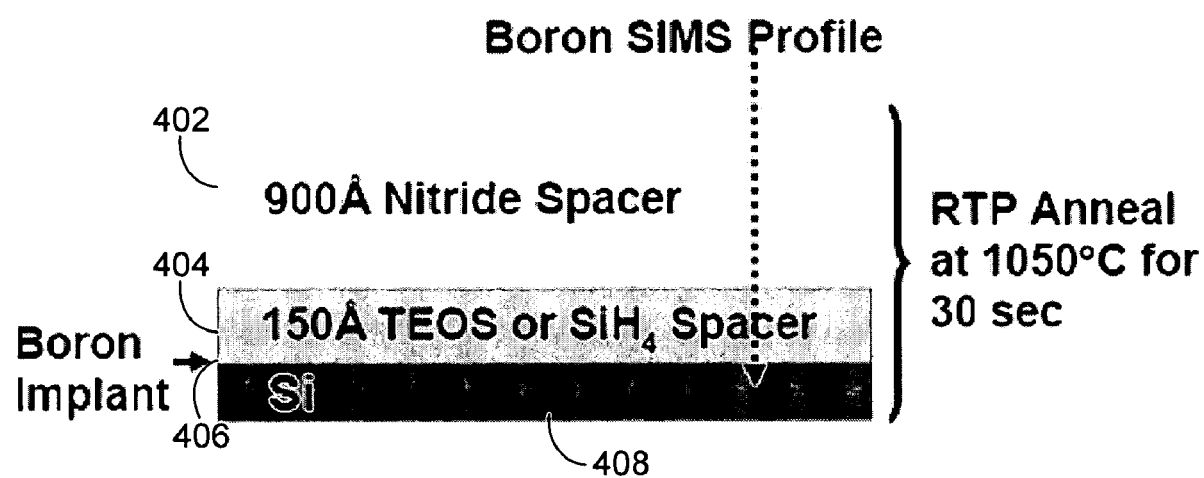
FIG. 4 shows a plot of the SIMS profile for a comparative boron diffusion test.

In the comparative boron diffusion tests, a boron implant was deposited on a silicon substrate, and then the oxy-nitride layer (or oxide layer) was formed over the boron dopant region at a thickness of about 150 Å. A nitride layer having a thickness of about 900 Å was formed on the oxy-nitride layer (or oxide layer). FIG. 4 shows the boron SIMS profile used to measure boron diffusion through the spacer layers following an RTP anneal at 1050° C. for 30 seconds. The SIMS profile starts with measurement of the boron concentration in the nitride spacer layer 402, working through to the oxy-nitride (or oxide) layer 404, to the boron implant layer 406 in the silicon substrate 408.

Figure 5:
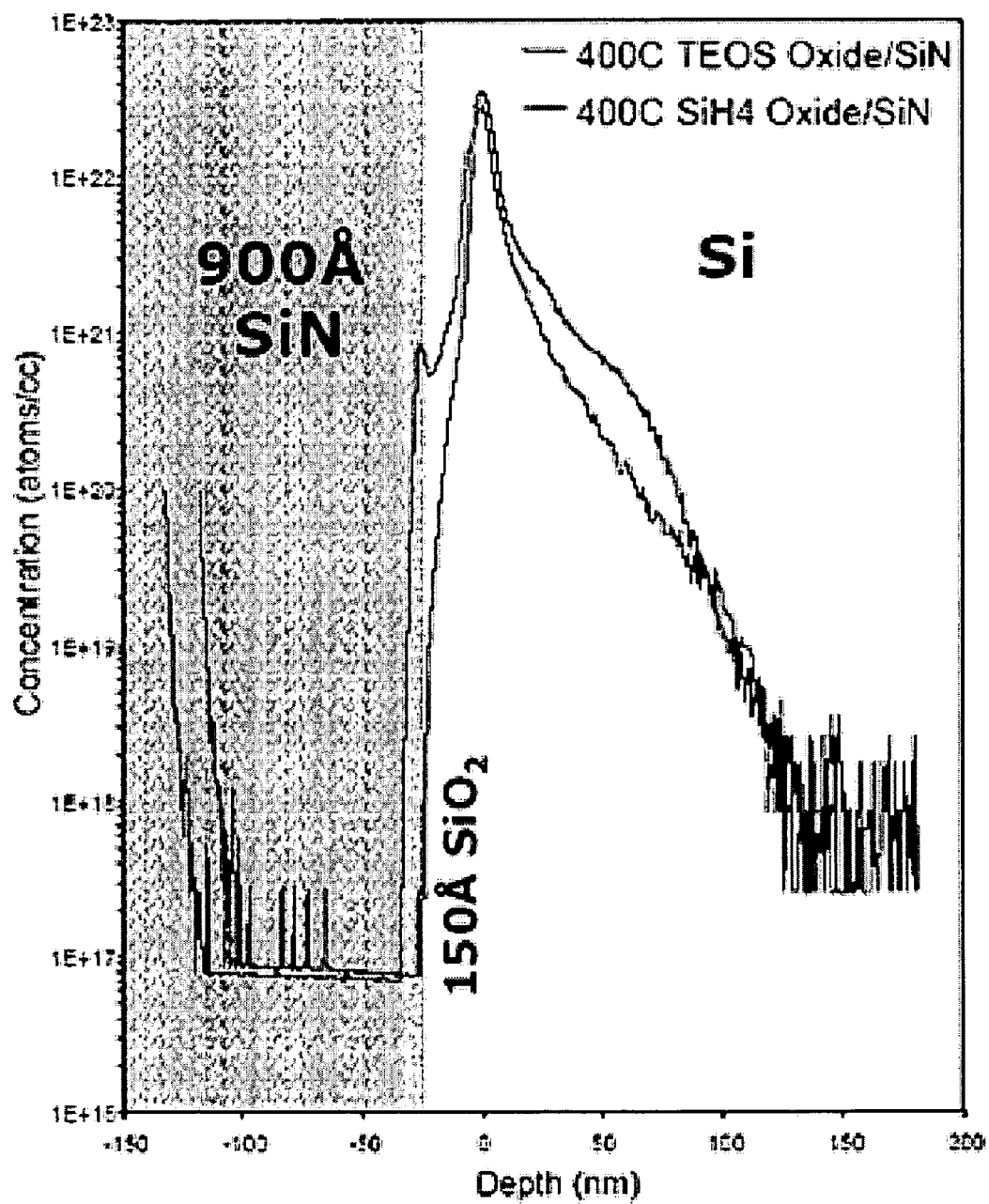
FIG. 5 shows SIMS plots of boron diffusion through sidewall spacers and gate electrodes.

FIG. 5 shows the SIMS profiles for sidewall spacer layers having the profile shown in FIG. 4. The plot shows a steeper drop in the boron concentration between the dopant region and the oxy-nitride layer than for the oxide layer. This indicates that the oxy-nitride layer is acting as a significantly more effective barrier to boron diffusion than the oxide layer. However, as Table 2 shows, the k value of the oxy-nitride layer (k=4.5) is comparable to the oxide layer (k=4.25). Thus, the oxy-nitride layer is a superior boron diffusion barrier to the oxide layer, without significantly increasing the k value of the spacer layer.

Exemplary Substrate Processing Chamber

Figure 6A:
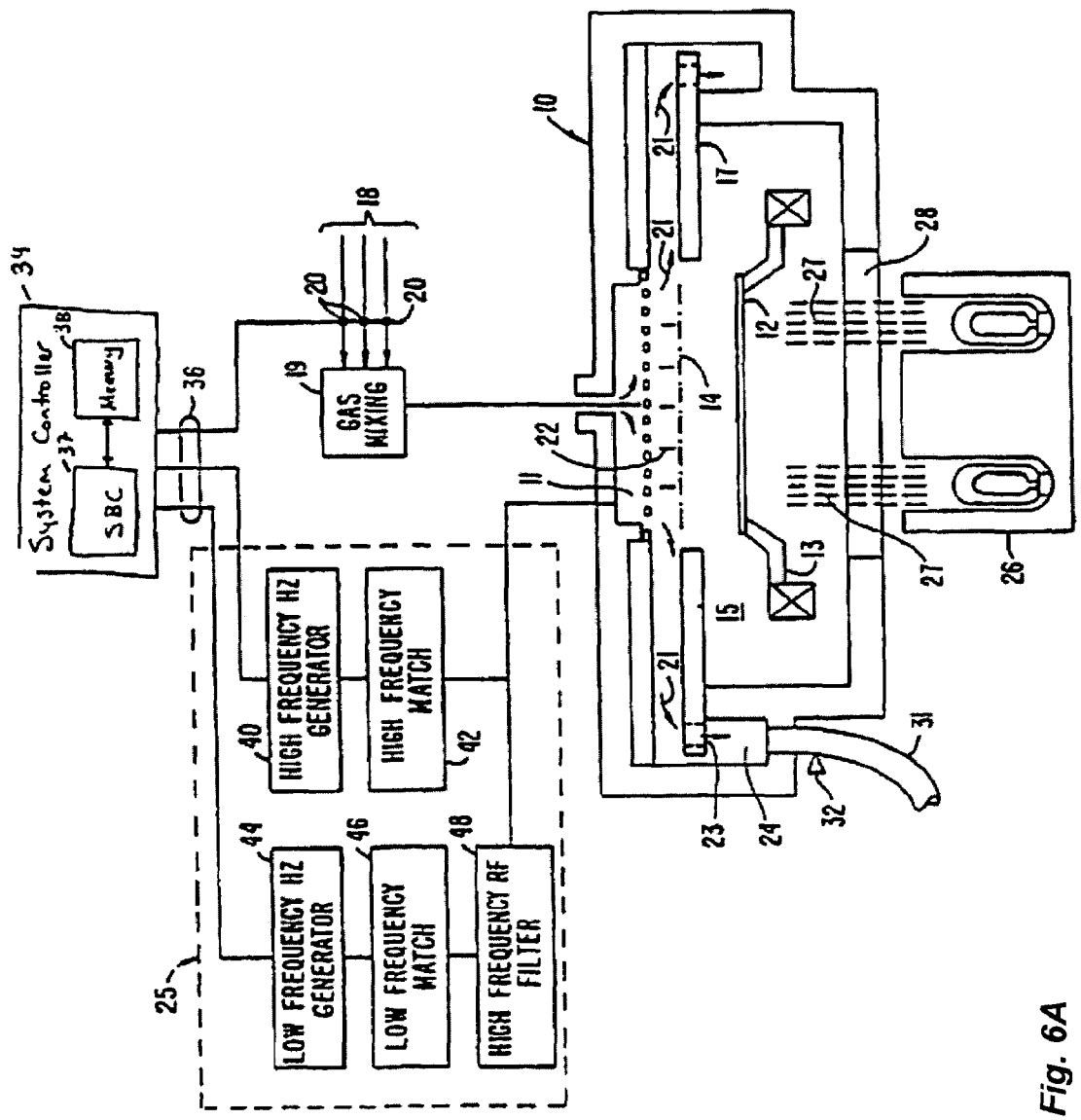
FIG. 6A shows a vertical, cross-sectional view of an embodiment of an apparatus for plasma CVD in which the methods of the present invention may be carried out.

Plasma CVD processes that may be used with embodiments of the invention include capacitively coupled plasma enhanced chemical vapor deposition (PECVD). FIG. 6A illustrates an embodiment of a parallel-plate (PECVD) system 10 that may be used in conjunction with embodiments of the methods of the present invention. System 10 includes a vacuum chamber 15 in which one or more layers may be deposited on a substrate (not shown). System 10 contains a gas distribution manifold 11 for dispersing process gases through perforated holes in manifold 11 to a substrate (e.g., a 200 mm wafer, 300 mm wafer, etc.) positioned on susceptor 12. Susceptor 12 is thermally responsive and is mounted on supports 13 such that the susceptor 12 (and the substrate) can be controllably moved between a lower loading/off-loading position and an upper processing position 14, which is in proximity to manifold 11. A center board (not shown) includes sensors for providing information on the position of the substrate.

When susceptor 12 and substrate are in processing position 14, they are surrounded by baffle plate 17 having a plurality of spaced holes 23 which exhaust into an annular vacuum manifold 24. Deposition and carrier gases are supplied through supply lines 18 into a mixing system 19 where they are combined and then sent to manifold 11. Supply lines 18 for each of the process gases may include (i) safety shut-off valves (not shown) that can be used to automatically or manually shut-off the flow of process gas into the chamber, and (ii) mass flow controllers 20 that measure the flow of gas or liquid through the supply lines. When toxic gases are used in the process, the several safety shut-off valves are positioned on each gas supply line in conventional configurations.

The rate at which deposition and carrier gases are supplied to gas mixing system 19 is controlled by liquid or gas mass flow controllers 20 and/or by valves. During processing, gas supplied to manifold 11 is vented toward and uniformly distributed radially across the surface of the wafer in a laminar flow as indicated by arrows 21 and 22. An exhaust system then exhausts the gas via ports 23 into the circular vacuum manifold 24 and out an exhaust line 31 by a vacuum pump system (not shown). The rate at which gases are released through exhaust line 31 is controlled by a throttle valve 32.

When performing a plasma enhanced process in system 10, a controlled plasma may be formed adjacent to the substrate by RF energy applied to manifold 11 from RF power supply 25. Manifold 11 may also act as an RF electrode, while susceptor 12 is grounded. RF power supply 25 may supply single or mixed frequency RF power (or other desired variations) to manifold 11 to enhance the decomposition of reactive species introduced into chamber 15. The mixed frequency RF power is generated by a high frequency RF generator 40 (RF1) and corresponding match circuit 42 and a low frequency RF generator 44 (RF2) and corresponding match circuit 46. A high frequency filter 48 prevents voltage generated by high frequency generator 40 from damaging the low frequency generator.

Heat is distributed by an external lamp module 26. External lamp heater module 26 provides a collimated annular pattern of light 27 through a quartz window 28 onto an annular outer peripheral portion of susceptor 12. Such heat distribution compensates for the natural heat loss pattern of susceptor 12 and provides rapid thermal and uniform susceptor and substrate heating for effecting deposition.

The chamber lining, gas distribution manifold faceplate, supports 13, and other system hardware may be made out of materials such as aluminum or anodized aluminum. An example of such an apparatus is described in U.S. Pat. No. 5,000,113 entitled "Thermal CVD/PECVD Reactor and Use for Thermal Chemical Vapor Deposition of Silicon Dioxide and In situ Multi-step Planarized Process," issued to Wang et al, an assigned to Applied Materials, Inc., the assignee of the present invention, the entire contents of which is herein incorporated by reference.

A motor (not shown) raises and lower susceptor 12 between a processing position 14 and a lower, substrate-loading position. Motors and optical sensors are used to move and determine the position of movable mechanical assemblies such as throttle valve 32 and susceptor 12. The heater, motors, valves and flow controllers 20 connected to supply lines 18, gas delivery system, throttle valve 32, RF power supply 25, and lamp magnet drivers are all controlled by a system controller 34 over control lines 36, some of which are shown in FIG. 6A.

System controller 34 controls activities of the apparatus. The system controller executes system control software, which is a computer program stored in a computer-readable medium such as a memory 38. Preferably, memory 38 may be a hard disk drive, but memory 38 may also be other kinds of memory. The computer program includes sets of instructions that dictate, for example, the timing, mixture of gases, chamber pressure, chamber temperature, RF power levels, susceptor position, and other parameters of a process. Other computer programs (e.g., one stored on another memory device such as a floppy disk or other program storage media) may also be used to operate processor 34.

The system controller may include a hard disk drive (memory 38), floppy disk drive and card rack, among other elements. The card rack contains a single board computer (SBC) processor 37, analog and digital input/output boards, interface boards and stepper motor controller boards. Various parts of system 10 may conform to the Versa Modular European (VME) standard that defies board, card cage, and connector dimensions and types. The VME standard also defines the bus structure having a 16-bit data bus and 24-bit address bus.

Figure 6B:
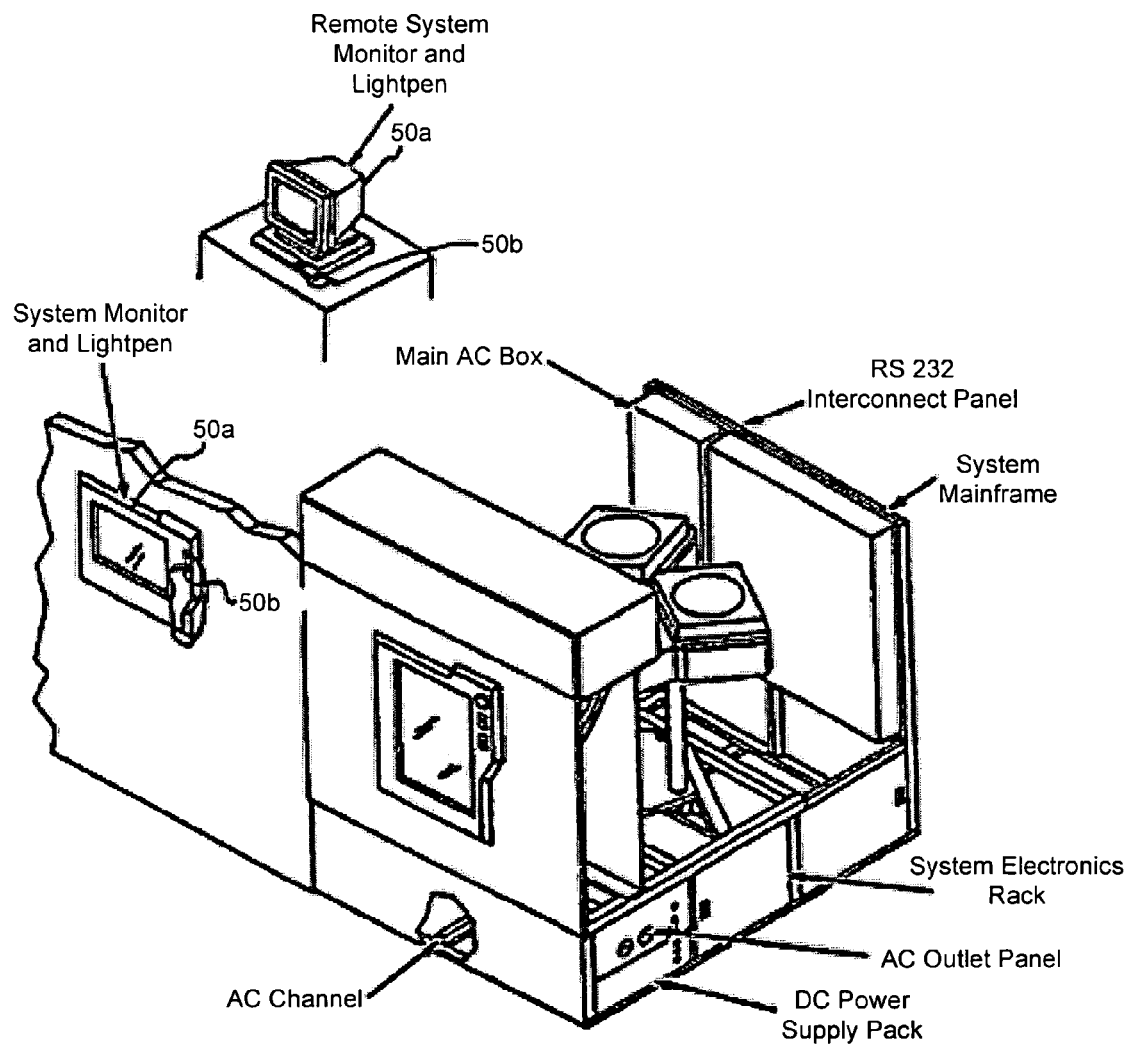
FIG. 6B shows a diagram of an embodiment of a system monitor an apparatus for plasma CVD that may be used with the methods of the present invention.

Referring now to FIG. 6B, a substrate processing apparatus including PECVD system 10 is shown. The apparatus also shows the interface between a user and processor via a monitor 50a and light pen 50b. In other embodiments, two monitors may be used, where a first monitor is located in a clean room (not shown) for apparatus operators, and a second monitor is located outside the clean room for viewing by service technicians. Both monitors may display the information.

Light pen 50b detects light emitted by monitor 50a with a light sensor in the tip of the pen. To select a particular screen or function, the operator touches a designated area of the display screen and pushes the button on pen 50b. The touched area changes its highlighted color, or a new menu or screen is displayed, confirming communication between the light pen and the display screen. Other devices (e.g., keyboard, mouse, etc.) may be used instead of (or in addition to) light pen 50b to allow the user to communicate with processor 34.

The process for depositing the film can be implemented using a computer program product that is executed by processor 34. The computer program code can be written in any conventional computer readable programming language, such as, 68000 assembly language, C, C++, Pascal, Java, Fortran, or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled windows library routines. To execute the linked compiled object code, the system user invokes the object code, causing the computer system to load the code in memory, from which the CPU reads and executes the code to perform the tasks identified in the program.

Figure 6C:
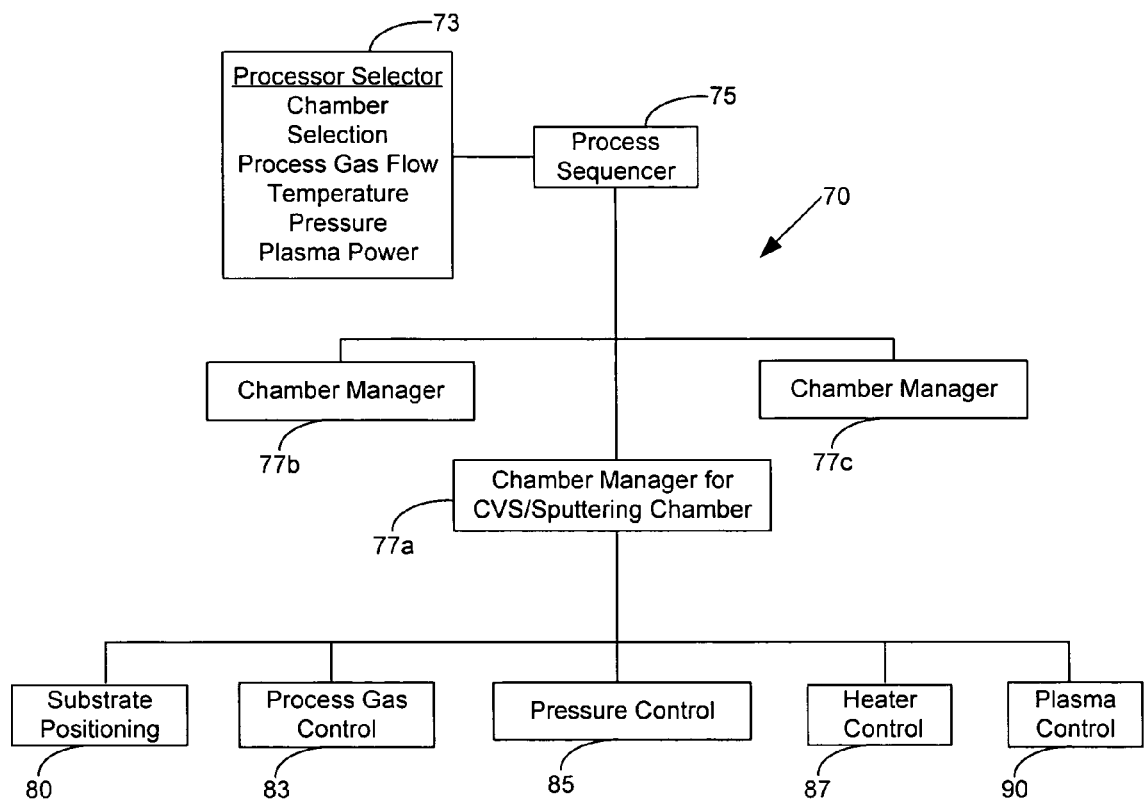
FIG. 6C shows a block diagram of an embodiment of a hierarchical control structure, including system control software used with the apparatus for plasma CVD.

FIG. 6C shows an illustrative block diagram of the hierarchical control structure of the system control software (e.g., computer program 70) according to embodiments of the apparatus. A user may enter a process set number and process chamber number into a process selector subroutine 73 in response to menus or screens displayed on the CRT monitor by using an interface (e.g., light pen 50b). The process sets are predetermined sets of process parameters necessary to carry out specified processes, and are identified by predefined set numbers. The process selector subroutine 73 may identify (i) the desired process chamber, and (ii) the desired set of process parameters needed to operate the process chamber for performing the desired process. The process parameters for performing a specific process relate to process conditions such as, for example, process gas composition and flow rates, temperature, pressure, plasma conditions (e.g., RF power levels, low frequency RF, etc.) cooling gas pressure, and chamber wall temperature, among others. They may be provided to the user in the form of a recipe. The parameters specified by the process recipe may be entered utilizing the light pen/monitor interface (50a–b).

Signals for monitoring the process are provided by the analog input and digital input boards of the system controller and the signals for controlling the process are output on the analog output and digital output boards of system 10.

A process sequencer subroutine 75 comprises program code that may accept the identified process chamber and set of process parameters from the process selector subroutine 73, and control operation of the various process chambers. Multiple users can enter process set numbers and process chamber numbers, or a user can enter multiple process set numbers and process chamber numbers, so the sequencer subroutine 75 operates to schedule the selected processes in the desired sequence. Preferably the sequencer subroutine 75 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, the sequencer subroutine 75 can be designed to take into consideration the present condition of the process chamber being used in comparison with the desired process conditions for a selected process, or the "age" of each particular user entered request, or any other relevant factor a system programmer desires to include for determining scheduling priorities.

Once the sequencer subroutine 75 determines which process chamber and process set combination is going to be executed next, the sequencer subroutine 75 causes execution of the process set by passing the particular process set parameters to a chamber manager subroutine 77a–c which controls multiple processing tasks in a process chamber 15 according to the process set determined by the sequencer subroutine 75. For example, the chamber manager subroutine 77a comprises program code for controlling sputtering and CVD process operations in the process chamber 15. The chamber manager subroutine 77 also controls execution of various chamber component subroutines which control operation of the chamber components necessary to carry out the selected process set. Examples of chamber component subroutines are substrate positioning subroutine 80, process gas control subroutine 83, pressure control subroutine 85, heater control subroutine 87, and plasma control subroutine 90. Those having ordinary skill in the art would readily recognize that other chamber control subroutines can be included depending on what processes are desired to be performed in the process chamber 15. In operation, the chamber manager subroutine 77a selectively schedules or calls the process component subroutines in accordance with the particular process set being executed. The chamber manager subroutine 77a schedules the process component subroutines similarly to how the sequencer subroutine 75 schedules which process chamber 15 and process set is to be executed next. Typically, the chamber manager subroutine 77a includes steps of monitoring the various chamber components, determining which components needs to be operated based on the process parameters for the process set to be executed, and causing execution of a chamber component subroutine responsive to the monitoring and determining steps.

Operation of particular chamber component subroutines will now be described with reference to FIG. 6C. The substrate positioning subroutine 80 comprises program code for controlling chamber components that are used to load the substrate onto the susceptor 12, and optionally to lift the substrate to a desired height in the chamber 15 to control the spacing between the substrate and the gas distribution manifold 11. When a substrate is loaded into the process chamber 15, the susceptor 12 is lowered to receive the substrate, and thereafter, the susceptor 12 is raised to the desired height in the chamber, to maintain the substrate at a first distance or spacing from the gas distribution manifold during the CVD process. In operation, the substrate positioning subroutine 80 controls movement of the susceptor in response to process set parameters related to the support height that are transferred from the chamber manager subroutine 77a.

The process gas control subroutine 83 has program code for controlling process gas composition and flow rates. The process gas control subroutine 83 controls the open/close position of the safety shut-off valves, and also ramps up/down the mass flow controllers to obtain the desired gas flow rate. The process gas control subroutine 83 is invoked by the chamber manager subroutine 77a, as are all chamber component subroutines, and receives from the chamber manager subroutine process parameters related to the desired gas flow rates. Typically, the process gas control subroutine 83 operates by opening the gas supply lines, and repeatedly (i) reading the necessary mass flow controllers, (ii) comparing the readings to the desired flow rates received from the chamber manager subroutine 77a, and (iii) adjusting the flow rates of the gas supply lines as necessary. Furthermore, the process gas control subroutine 83 includes steps for monitoring the gas flow rates for unsafe rates, and activating the safety shut-off valves when an unsafe condition is detected.

In some processes, an inert gas such as argon is flowed into the chamber 15 to stabilize the pressure in the chamber before reactive process gases are introduced into the chamber. For these processes, the process gas control subroutine 83 is programmed to include steps for flowing the inert gas into the chamber 15 for an amount of time necessary to stabilize the pressure in the chamber, and then the steps described above would be carried out. Additionally, when a process gas is to be vaporized from a liquid precursor, for example tetraethylorthosilane ("TEOS"), the process gas control subroutine 83 would be written to include steps for bubbling a delivery gas such as helium through the liquid precursor in a bubbler assembly or introducing a carrier gas such as helium to a liquid injection system. When a bubbler is used for this type of process, the process gas control subroutine 83 regulates the flow of the delivery gas, the pressure in the bubbler, and the bubbler temperature in order to obtain the desired process gas flow rates. As discussed above, the desired process gas flow rates are transferred to the process gas control subroutine 83 as process parameters. Furthermore, the process gas control subroutine 83 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The pressure control subroutine 85 comprises program code for controlling the pressure in the chamber 15 by regulating the size of the opening of the throttle valve in the exhaust system (not shown) of the chamber. The size of the opening of the throttle valve is set to control the chamber pressure to the desired level in relation to the total process gas flow, size of the process chamber, and pumping setpoint pressure for the exhaust system. When the pressure control subroutine 85 is invoked, the desired, or target, pressure level is received as a parameter from the chamber manager subroutine 77a. The pressure control subroutine 85 operates to measure the pressure in the chamber 15 by reading one or more conventional pressure manometers connected to the chamber, compare the measure value(s) to the target pressure, obtain PID (proportional, integral, and differential) values from a stored pressure table corresponding to the target pressure, and adjust the throttle valve according to the PID values obtained from the pressure table. Alternatively, the pressure control subroutine 85 can be written to open or close the throttle valve to a particular opening size to regulate the chamber 15 to the desired pressure.

The heater control subroutine 87 comprises program code for controlling the temperature of the lamp module that is used to heat the substrate. The heater control subroutine 87 is also invoked by the chamber manager subroutine 77a and receives a target, or setpoint, temperature parameter. The heater control subroutine 87 measures the temperature by measuring voltage output of a thermocouple located in a susceptor 12, compares the measured temperature to the setpoint temperature, and increases or decreases current applied to the lamp module 26 to obtain the setpoint temperature. The temperature is obtained from the measured voltage by looking up the corresponding temperature in a stored conversion table, or by calculating the temperature using a fourth order polynomial. When radiant lamps are used to heat the susceptor 12, the heater control subroutine 87 gradually controls a ramp up/down of current applied to the lamp. The gradual ramp up/down increases the life and reliability of the lamp. Additionally, a built-in fail-safe mode can be included to detect process safety compliance, and can shut down operation of the lamp module 26 if the process chamber 15 is not properly set up.

The plasma control subroutine 90 comprises program code for setting low and high frequency the RF power levels applied to the process electrodes in the chamber 15, and to set the low frequency RF frequency employed. Similar to the previously described chamber component subroutines, the plasma control subroutine 90 is invoked by the chamber manager subroutine 77a.

The above reactor description is mainly for illustrative purposes an variations in components such as susceptor design, heater design, RF power frequencies, location of RF power connections and others are possible. For example, the substrate could be supported and heated by a resistively heated platen. The methods of the present invention are not limited to a specific PECVD apparatus like the one shown.

Having described several embodiments, it will be recognized by those of skill in the art that various modifications, alternative constructions, and equivalents may be used without departing from the spirit of the invention. Additionally, a number of well known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the electrode" includes reference to one or more electrodes and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

What is claimed is:

1. A method of forming a sidewall spacer on a gate electrode, the method comprising:
   generating a first plasma from a silicon containing precursor and oxide precursor, and forming a silicon oxy-nitride layer on the sidewall of the gate electrode; and
   generating a second plasma from the silicon containing precursor and a nitrogen precursor, and forming a nitride layer on the silicon oxy-nitride layer, wherein the silicon containing precursor flows continuously between the generation of the first and the second plasmas.

2. The method of claim 1, wherein the plasma is continuously maintained between the generation of the first and second plasma when the oxide precursor supplied to the first plasma is replaced by the nitride precursor supplied to the second plasma.

3. The method of claim 1, wherein the oxide precursor comprises $N_2O$.

4. The method of claim 1, wherein the oxide precursor comprises a mixture of an oxygen containing gas and a nitrogen containing gas.

5. The method of claim 4, wherein the oxygen containing gas comprises $N_2O$, $O_2$, or $CO_2$, and the nitrogen containing gas comprises $NH_3$.

6. The method of claim 1, wherein the silicon containing precursor comprises SiH4.

7. The method of claim 1, wherein the nitrogen precursor comprises $NH_3$.

8. The method of claim 1, wherein the sidewall spacer is formed at about 500° C. or less.

9. The method of claim 1, wherein the sidewall spacer has a k value of about 5.0 or less.

10. The method of claim 1, wherein the method further comprises etching the sidewall spacer.

11. The method of claim 1, wherein the method further comprises forming a silicide layer on a top side of the gate electrode.

12. A method of forming a sidewall spacer on a substrate wafer comprising a gate electrode, the method comprising:

generating a first plasma from a silicon containing precursor and oxide precursor, and forming an oxide layer on the sidewall of the gate electrode, wherein at least a portion of the layer comprises silicon oxy-nitride; and generating a second plasma from the silicon containing precursor and a nitrogen precursor, and forming a nitride layer on the oxide layer, wherein the substrate wafer is not exposed to air between the generation of the first and second plasma.

13. The method of claim 12, wherein the silicon containing precursor flows continuously between the generation of the first and the second plasmas.

14. The method of claim 13, wherein the plasma is continuously maintained between the generation of the first and second plasma when the oxide precursor supplied to the first plasma is replaced by the nitride precursor supplied to the second plasma.

15. The method of claim 12, wherein the first and second plasmas are generated in a plasma-enhanced chemical vapor deposition (PECVD) chamber.

16. The method of claim 12, wherein a portion of the oxide layer that is adjacent to the nitride layer comprises silicon oxy-nitride.

17. The method of claim 12, wherein the oxide layer has a k value of about 4.5 or less.

18. The method of claim 12, wherein the nitride layer has a k value of about 7 or more.

19. The method of claim 12, wherein the spacer layer has an overall k value range of about 5.0 or less.

20. The method of claim 12, wherein the oxide precursor is comprises nitrous oxide.

21. The method of claim 12, wherein the oxide precursor comprises a mixture of oxygen and ammonia.

22. The method of claim 12, wherein the nitrogen concentration in the oxide layer is about 5% to about 6%, by wt.

23. The method of claim 12, wherein the silicon containing precursor is selected from the group consisting of silane and BTBAS.

24. The method of claim 12, wherein the nitrogen precursor comprises $NH_3$.

25. The method of claim 12, wherein the sidewall spacer is formed at about 500° C. or less.

26. The method of claim 12, wherein the method further comprises etching the sidewall spacer.

27. The method of claim 12, wherein the method further comprises forming a silicide layer on a top side of the gate electrode.

28. A process of fabricating a transistor comprising a gate electrode, the process comprising:

depositing a first dopant region, at least a portion of which is under the gate electrode;

forming a sidewall spacer comprising an oxy-nitride layer on the gate electrode by generating a first plasma from a silicon containing precursor and oxide precursor, and a nitride layer by generating a second plasma from a silicon containing precursor and a nitrogen precursor; and depositing a second dopant region adjacent to the first dopant region, wherein at least a portion of the second dopant region is under the sidewall spacer.

29. The method of claim 28, wherein the nitrogen concentration in the oxy-nitride layer is about 5% to about 6%, by wt.

30. The method of claim 28, wherein the oxide precursor comprises $N_2O$.

31. The method of claim 28, wherein the oxide precursor comprises a mixture of an oxygen containing gas and a nitrogen containing gas.

32. The method of claim 31, wherein the oxygen containing gas comprises $O_2$, and the nitrogen containing gas comprises $NH_3$.

33. The method of claim 28, wherein the oxide layer has a k value of about 4.5 or less.

34. The method of claim 28, wherein the first dopant region comprises a dopant implant region, and the second dopant region comprises a source or drain region.

35. The process of claim 28, wherein the method further comprises etching the sidewall spacer.

36. The process of claim 28, wherein the method further comprises forming a silicide layer on a top side of the gate electrode.

* * * * *